– – –

United States Patent [19]

Akita et al.

[11] 4,164,706
[45] Aug. 14, 1979

[54] ROTATIONAL POSITION DETECTOR UTILIZING AN FET BLOCKING OSCILLATOR

[75] Inventors: Sigeyuki Akita, Aichi; Junji Kitagawa, Okazaki, both of Japan

[73] Assignee: Nippon Soken, Inc., Nishio, Japan

[21] Appl. No.: 828,106

[22] Filed: Aug. 26, 1977

[30] Foreign Application Priority Data

Oct. 18, 1976 [JP] Japan ................................ 51-125285
Jan. 10, 1977 [JP] Japan ................................ 52-1868[U]
Jan. 13, 1977 [JP] Japan ................................ 52-2954[U]

[51] Int. Cl.$^2$ ............................................. G01B 7/00
[52] U.S. Cl. ........................................ 324/208; 331/65; 331/112; 123/148 E; 324/16 T
[58] Field of Search ................ 324/166, 168, 173, 207, 324/208, 236; 331/65, 112, 146; 123/148 E

[56] References Cited

U.S. PATENT DOCUMENTS

| 2,297,742 | 10/1942 | Cambell | 331/146 |
| 2,922,880 | 1/1960 | Elam | 331/65 |
| 3,424,142 | 1/1969 | Nilssen et al. | 123/148 E |

OTHER PUBLICATIONS

Garner, Jr.; L. E., Meet Mr. FET.... The Transistor That Thinks Is A Tube, Popular Electronics, Feb. 1967, pp. 47–53, 94.

Primary Examiner—Robert J. Corcoran
Assistant Examiner—Walter E. Snow
Attorney, Agent, or Firm—Cushman, Darby & Cushman

[57] ABSTRACT

A rotation detecting apparatus detects the angular position of an engine by rotating from the engine an electrically conductive rotating member having a plurality of equally spaced projections and notches formed on the periphery thereof and arranging a detector to face the rotating member and detect its projections and notches. The detector incorporates a self-running blocking oscillator circuit comprising a transformer and a field-effect transistor. With the engine rotating, the oscillator circuit oscillates when one of the notches on the rotating member is opposite to the detector, whereas when one of the projections on the rotating member is opposite to the detector the oscillator circuit does not oscillate due to the eddy current loss caused in the projection. Another circuit is connected to the oscillator circuit, and this circuit generates a pulse signal whose signal level changes in synchronism with a change in the oscillation condition of the oscillator circuit. This signal level change is indicative of a predetermined angular position of the engine.

5 Claims, 6 Drawing Figures

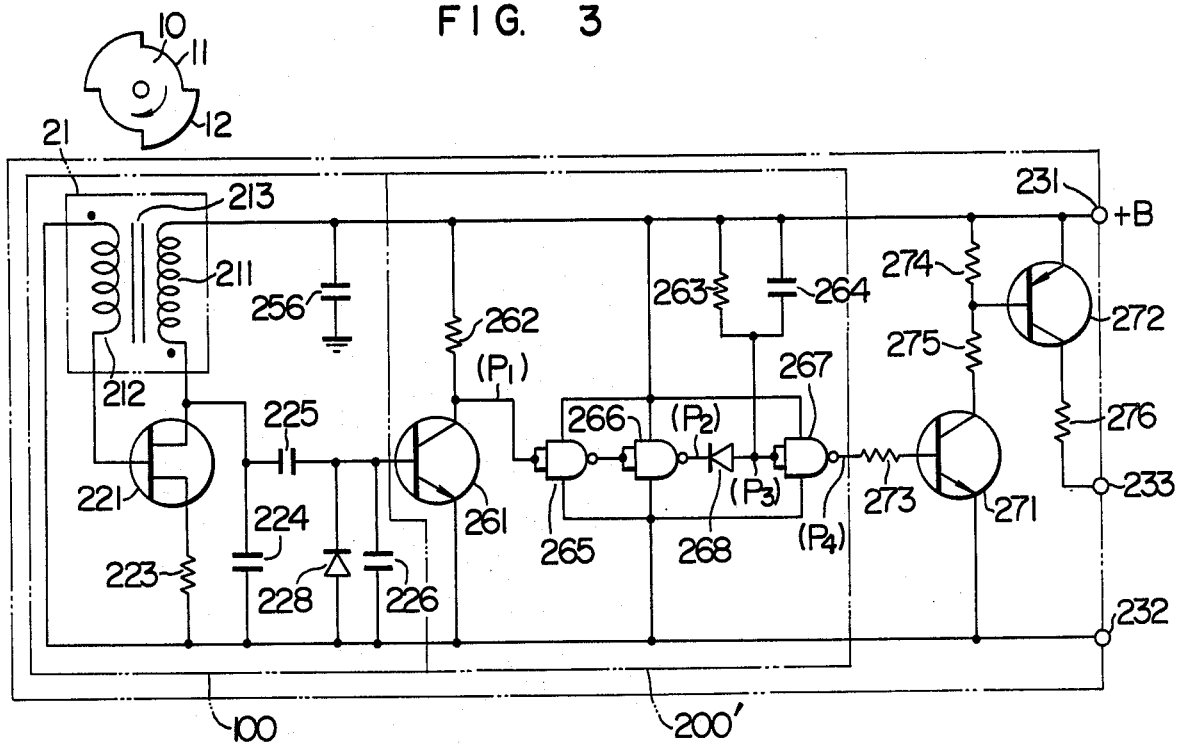
FIG. 3
FIG. 4
($P_1$)
($P_2$)
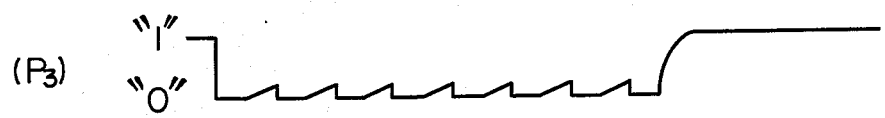
($P_3$)
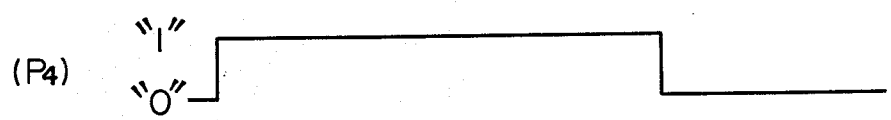
($P_4$)

ROTATIONAL POSITION DETECTOR UTILIZING AN FET BLOCKING OSCILLATOR

BACKGROUND OF THE INVENTION

The present invention relates to an apparatus for detecting the angular position of an engine or the like, and more particularly the invention relates to an apparatus for detecting the angular position of an engine or the like stably against variations in the rotational speed thereof.

A detecting apparatus of this type is known in the art in which a magnetic member with a coil wound thereon is arranged opposite to a rotating member having high magnetic permeability, an alternating electromotive force is induced in the coil in response to the variation of the magnetic flux caused by the projections and notches on the rotating member, thereby detecting the rotation of the rotating member. A disadvantage of this type of apparatus is that, since the alternating electromotive force induced in the coil is affected by the variation of the magnetic flux which is dependent on the rotational speed of the rotating member, no alternating electromotive force is produced practically when the rotational speed of the rotating member is low.

SUMMARY OF THE INVENTION

It is an object of the present invention to provide an apparatus for detecting the angular position of a rotating member, comprising a self-running blocking oscillator circuit including a transformer with primary and secondary coils wound thereon and a field-effect transistor, and a rotating member made of an electrically conductive material with projections and notches on the periphery thereof and rotatably disposed opposite to the rotor disk, whereby the degree of magnetic coupling between the primary and secondary coils is changed in response to the projections and notches on the rotating member facing the transformer, thus causing the oscillator circuit to start and stop oscillations and thereby detecting the angular position of the rotating member without being affected by the variation in the rotational speed of the rotor disk.

It is another object of the invention to provide an apparatus for detecting the angular position of a rotating member wherein an oscillator circuit includes a field-effect transistor, whereby the oscillating action of the oscillator circuit is not affected by the variation of the ambient temperature.

It is still another object of the invention to provide an apparatus for detecting the angular position of a rotating member wherein a change in the oscillation condition of an oscillator circuit is detected without any time delay thereby generating a pulse signal whose signal level changes each time the rotating member reaches a predetermined angular position.

BRIEF DESCRIPTION OF THE DRAWINGS

FIG. 3 is a partially schematic wiring diagram showing a second embodiment of the invention.

FIG. 4 is a waveform diagram showing the signal waveforms ($P_1$) to ($P_4$) generated at various points in the second embodiment of FIG. 3.

DESCRIPTION OF THE PREFERRED EMBODIMENTS

The present invention will now be described in greater detail with reference to the accompanying drawings.

Figure 1:
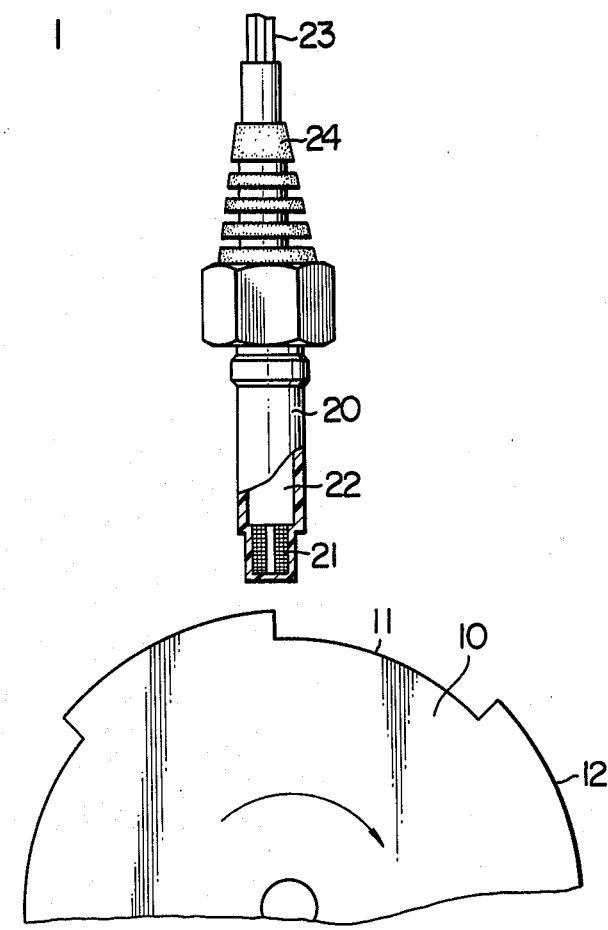
FIG. 1 is a schematic diagram showing the general construction of a rotation detecting apparatus according to the invention with a part broken away.

Referring first to FIG. 1 showing the general construction of a rotation detecting apparatus according to the invention, numeral 10 designates an electrically conductive rotor disk mounted for example on the crankshaft of an engine or the rotary shaft synchronized with the engine rotation, with equally spaced notches 11 and projections 12 formed on the periphery thereof. Numeral 20 designates a detector disposed opposite to the outer periphery of the rotor disk 10 and comprising a transformer 21 with a core having primary and secondary coils wound thereon; an electric circuit section 22 including an oscillator circuit and a detector circuit for detecting the oscillation condition of the oscillator circuit, a lead wire 23 from the electric circuit section 22, and a rubber cap 24 for protecting the electric circuit section 22 and the lead wire 23.

Figure 2:
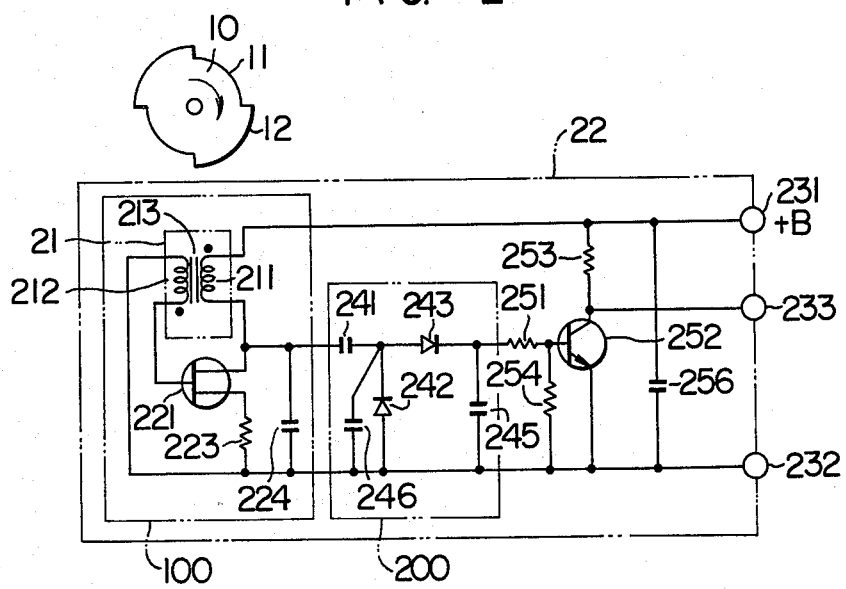
FIG. 2 is a partially schematic wiring diagram showing a first embodiment of the invention.

In FIG. 2 showing a first embodiment of the apparatus of the invention shown in FIG. 1, numeral 231 designates a power supply terminal, 232 a ground terminal, 233 a signal output terminal, and the notches 11 and the projections 12 are arranged at intervals of 90 degrees on the rotor disk 10. A block 100 is a blocking oscillator circuit comprising the transformer 21, a field-effect transistor 221 (hereinafter referred to as an FET), a resistor 223 and a capacitor 224. The transformer 21 has primary and secondary coils 211 and 212 wound on its core 213 for applying a positive feedback to the FET 221. The primary coil 221 has its one end connected to the power supply terminal 231 and its other end connected to the drain terminal of the FET 221, and the secondary coil 212 has its one end connected to the gate terminal of the FET 221 and its other end connected to the ground terminal 232 connected to the ground line. The oscillator circuit 100 is connected to a filter circuit 200 comprising capacitors 241, 245 and 246 and diodes 242 and 243, and the output signal of the filter circuit 200 is generated at the output terminal 233 through a transistor 252 in the form of a pulse signal whose level corresponds respectively to the projections and notches on the rotor disk 10. Numerals 251, 253 and 254 designate resistors for causing the switching operation of the transistor 252, and numeral 256 designates a capacitor.

With the construction described above, the operation of the first embodiment is as follows. When the notch 11 on the outer periphery of the rotor disk 10 is opposite to the transformer 21, the oscillator circuit 100 of FIG. 2 starts blocking oscillation by virtue of the mutual induction and self-induction of the coils 211 and 212. This oscillating action is caused by the fact that in response to a change in the magnetic flux produced by the current flowing in the primary coil 211 of the transformer 21, a voltage is induced in the secondary coil 212 in a direction to cancel the flux produced by the coil 211 and a bias is established between the gate and source of the FET 221. At that time, the outer periphery of the notch 11 on the rotor disk 10 and the transformer 21 are not close to each other, and thus the magnetic flux in the transformer 21 is not practically affected by the present position or rotation of the rotor disk 10. The resulting oscillation signal train is converted by the filter circuit 200 into a voltage which turns on the transistor 252. Consequently, the output terminal 233 has a voltage equal to the ground potential (this voltage is hereinafter referred to as a "0" signal). As the rotor disk 10 rotates further so that the projection 12 is now opposite to the transformer 21, the outer periphery of the projection 12 on the rotor disk 10 approaches the transformer 21 and an eddy current loss is caused in the projection 12. Thus, the positive feedback is no longer provided and the oscillation of the oscillator circuit 100 is stopped. In other words, the transformer 21 and the projection 12 on the rotor disk 10 approach each other, and consequently the magnetic flux produced in the core 213 by the primary coil 211 also passes through the projection 12. Since the rotor disk 10 is electrically conductive, an eddy current is produced in the projection 12 and this eddy current produces a magnetic flux in a direction to cancel the magnetic flux produced by the primary coil 211. When these magnetic fluxes cancel each other, practically no voltage is induced in the secondary coil 212 and the oscillation is stopped. Consequently, the voltage is no longer produced from the filter circuit 200 and the transistor 252 is turned off. Thus, a voltage ("1" signal) which is equal to the power source potential, is produced at the output terminal 233. In this way, the transistor 252 is turned on and off in response to the notches and projections on the rotor disk 10 respectively, thus producing the corresponding "0" and "1" signals at the output terminal 233.

Thus, with the oscillator circuit 100 of this embodiment comprising the transformer 21 and the FET 221, the input impedance of the FET 21 is on the order of $10^2$ to $10^8$ ($\Omega$) which is higher than the input impedance ($\Omega$) of transistors or the like, and thus the oscillator circuit 100 is caused to oscillate or stop oscillating in response to a small variation in the eddy current loss of the rotor disk 10 arranged opposite to the transformer 21. Consequently, the rotor disk 10 and the transformer 21 need not always be disposed close to each other. Further, since it is well known that the FET 221 has a portion where the bias point does not change with temperature changes, if the value of the voltage induced in the secondary coil 212 is preset to a value near the bias point, the oscillator circuit 100 can be caused to repeatedly start and stop oscillations in response to the notches 11 and projections 12 on the rotor disk 10 in a stable manner against temperature changes.

FIG. 3 shows a second embodiment of this invention in which the component parts identical with those of the first embodiment are designated by the same reference numerals, and therefore only those points which are different in construction will be described. The oscillator circuit 100 includes additionally capacitors 225 and 226 and a diode 228 for changing the waveform of the output signal of the FET 221, and the transformer 21 is connected to the FET 221 in opposite polarity. More specifically, the primary coil 211 has its winding beginning end connected to the drain terminal of the FET 221 and its terminating end connected to the power supply terminal 231, and the secondary coil 212 has its winding beginning end connected to the ground terminal 232 and its terminating end connected to the gate terminal of the FET 221. In addition, a demodulation circuit 200' is connected to the oscillator circuit 100. The demodulation circuit 200' comprises a transistor 261, resistors 262 and 263, a capacitor 264, inverter gates 265, 266 and 267 and a diode 268. Also transistors 271 and 272 and resistors 273, 274, 275 and 276 are additionally connected so that in response to the signal from the demodulation circuit 200', a pulse signal is generated at the output terminal 233 whose signal level changes in response to the projections 12 and notches 11 on the rotor disk 10.

With the construction described above, the operation of the second embodiment is as follows. When the notch 11 on the periphery of the rotor disk 10 is opposite to the transformer 21, the oscillator circuit 100 oscillates by virtue of the mutual induction and self-induction of the coils 211 and 212, and this oscillation signal train is reshaped by the capacitors 225 and 226 and the diode 228 and then applied to the transistor 261 of the demodulation circuit 200', thus generating at the collector 261 or a point $P_1$ the oscillation signal train shown in ($P_1$) of FIG. 4. The signals in ($P_1$) of FIG. 4 are reshaped by the inverter gates 265 and 266, thus producing at the output of the inverter gate 266 or a point ($P_2$) the rectangular waveform oscillation signal train shown in ($P_2$) of FIG. 4. The signal train in ($P_2$) of FIG. 4 is then subjected to signal waveform conversion by the resistor 263, the capacitor 264 and the diode 268, and thus the signals shown in ($P_3$) of FIG. 4 are produced at a point ($P_3$) or the input of the inverter gate 267 which in turn continuously generates at its output or a point ($P_4$) the "1" level signal shown in ($P_4$) of FIG. 4. The "1" level signal shown in ($P_4$) of FIG. 4 is applied to the transistor 271 thus turning it on. Consequently, the transistor 272 is also turned on, thus generating a "1" level signal at the output terminal 233. Then, as the projection 12 on the rotor disk 10 is placed opposite to the transformer 21, an eddy current loss is caused by the projection 12 and the oscillation of the oscillator circuit 100 is stopped. Consequently, a "0" level signal is generated at the base of the transistor 261 in the demodulation circuit 200', and the "1" level signal shown in ($P_1$) of FIG. 4 is continuously generated at the collector of the transistor 261. This "1" level signal shown in ($P_1$) of FIG. 4 is then subjected to signal conversion through the inverter gates 265, 266 and 267 and the diode 268, and the "0" level signal shown in ($P_4$) of FIG. 4 is continuously generated at the output of the inverter gate 267. This "0" level signal shown in ($P_4$) of FIG. 4 is then applied to the transistor 271, and consequently the transistor 271 is turned off. This also turns the transistor 272 off, and a "0" level signal is generated at the output terminal 233. In this way, "1" and "0" level signals are generated at the output terminal 233 in response to the notches and projections on the rotor disk 10, respectively. While, in this second embodiment, the signal level of a pulse signal generated at the output terminal 233 is opposite to that of the first embodiment, it is possible to design so that the same signal levels as in the case of the first embodiment may be generated in response to the notches and projections on the rotor disk 10. The use of the demodulation circuit 200' in the second embodiment has the effect of ensuring more accurate detection of changes in the oscillation condition of the oscillator circuit 100 and the detection of the rotation of the rotor disk 10 without any time delay as compared with the first embodiment using the filter circuit 200.

Figure 5:
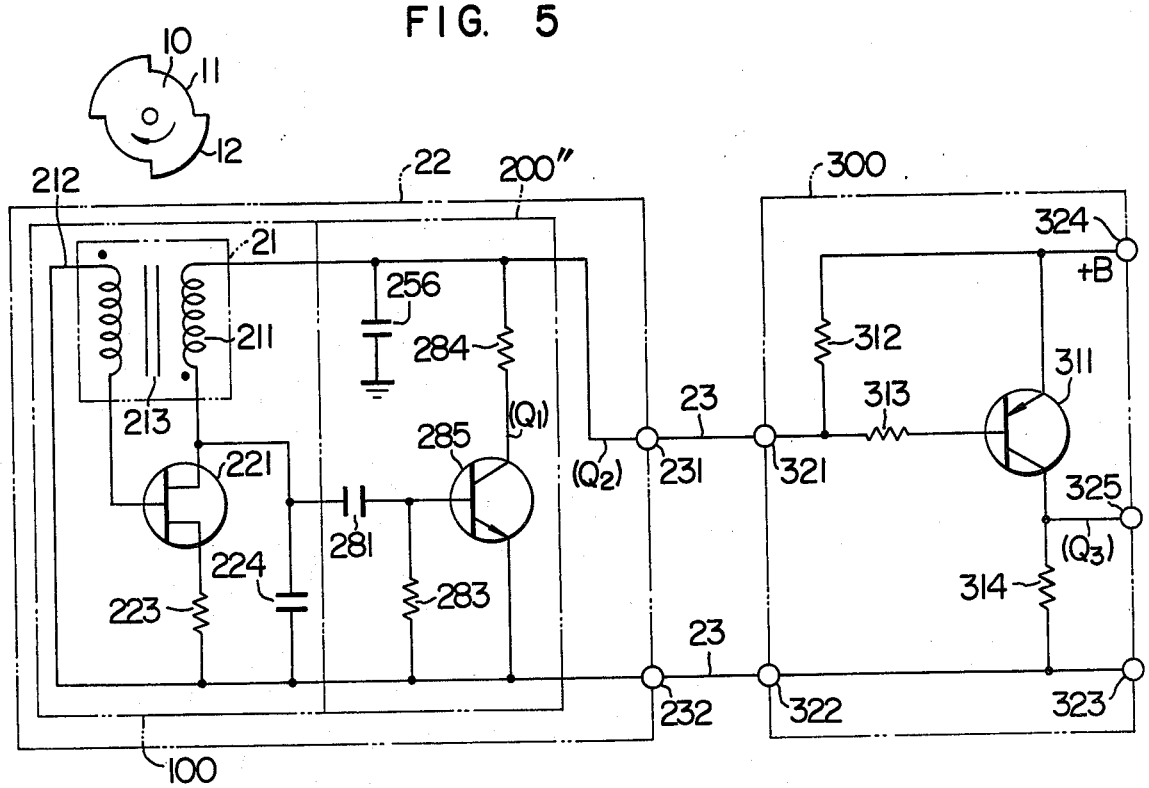
FIG. 5 is a partially schematic wiring diagram showing a third embodiment of the invention.

FIG. 5 shows a third embodiment of the invention in which the component parts identical with those of the first and second embodiments are designated by the same reference numerals, and only different points in construction will be described. Firstly, a current value converter circuit 200″ is connected to the oscillator circuit 100, and this converter circuit 200″ comprises a capacitor 281, resistors 283 and 284 and a transistor 285. This converter circuit 200″ has no signal output terminal, and the power supply terminal 231 and the ground terminal 232 are connected to a signal detector circuit 300 through the lead wires 23 shown in FIG. 1. This signal detector circuit 300 comprises a transistor 311 and resistors 312, 313 and 314, and the detector circuit 300 has a power supply terminal 321 and a ground terminal 322 on its input side and a ground terminal 323, a power supply terminal 324 and an output signal terminal 325 on its output side.

Figure 6:
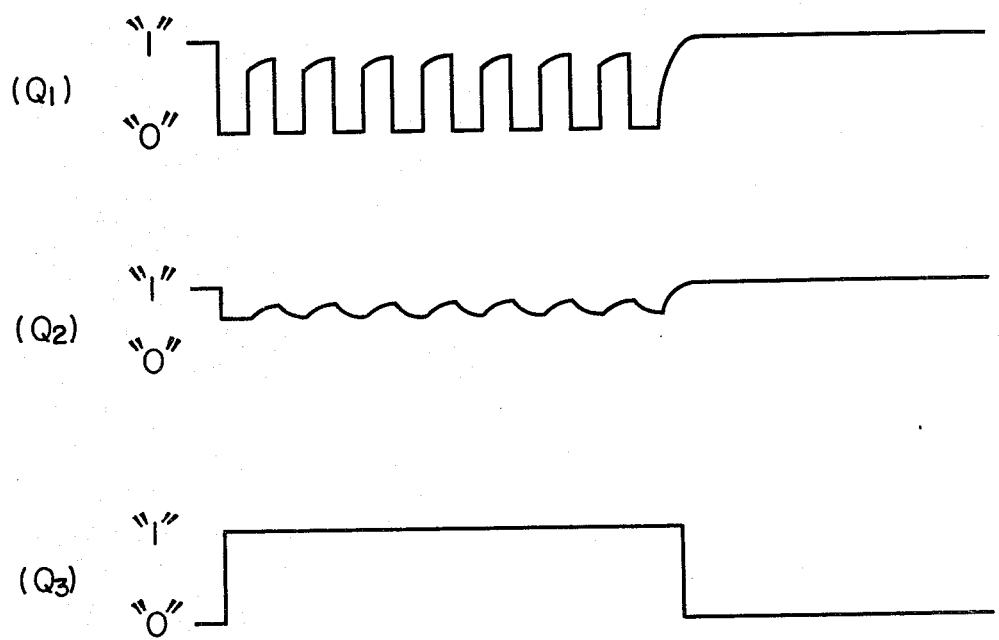
FIG. 6 is a waveform diagram showing the signal waveforms ($Q_1$) to ($Q_3$) generated at various points in the third embodiment of FIG. 5.

With the construction described above, the third embodiment operates as follows. When the notch 11 of the rotor disk 10 is opposite to the transformer 21, the oscillator circuit 100 oscillates by virtue of the mutual induction and self-induction of the coils 211 and 212. The resulting oscillation signal train is applied to the current value converter circuit 200″. When the output signal of the oscillator circuit 100 goes to the "1" level, the transistor 285 is turned on so that a current flows in the resistor 284 and a voltage drop is caused thereacross, thus causing the potential at the power supply terminal 231 to become lower than the "1" level. Then, as the output signal of the oscillator circuit 100 goes to the "0" level, the transistor 285 is turned off so that no current flows in the resistor 284, and the collector of the transistor 285 and the power supply terminal 231 tend to go to the "1" level. However, by virtue of the time constant of the capacitor 256 and the input impedance of the signal detector circuit 300, the output signal of the oscillator circuit 100 goes to the "1" level before the collector of the transistor 285 and the power supply terminal 231 completely change to the "1" level, and consequently the collector of the transistor 285 goes to the "0" level. Thus, as long as the oscillation signals from the oscillator circuit 100 are applied to the current value converter circuit 200″, the signals shown respectively in ($Q_1$) and ($Q_2$) of FIG. 6 are generated respectively at the collector of the transistor 285 or a point ($Q_1$) and the power supply terminal 231 or a point ($Q_2$). The signal shown in ($Q_2$) of FIG. 6 is applied to the power supply terminal 321 of the signal detector circuit 300 so that the transistor 311 is turned on and a "1" level signal is generated at the output terminal 325 or a point ($Q_3$) as shown in ($Q_3$) of FIG. 6. On the contrary, when the projection 12 of the rotor disk 10 is opposite to the transformer 21, an eddy current loss is caused by the projection 12 and the oscillation of the oscillator circuit 100 is stopped. Consequently, the base of the transistor 285 of the current value converter circuit 200″ goes to the "0" level, and the "1" level signal shown in ($Q_1$) of FIG. 6 is continuously generated at the collector of the transistor 285. As a result, the signal at the power supply terminal 231 also goes to the "1" level as shown in ($Q_2$) of FIG. 6 and the potential at the power supply terminal 321 of the signal detector circuit 300 is maintained constant. Consequently, the transistor 311 is turned off, and a "0" level signal is generated at the output terminal 325 as shown in ($Q_3$) of FIG. 6. Thus, "1" and "0" level signals are generated at the output terminal 325 in response to the notches 11 and the projections 12 of the rotor disk 10. With this third embodiment, due to the absence of a filter circuit, the prevention of time delay in detecting the rotation of rotor disk 10 is made possible.

With any of the first, second and third embodiments, the signal level of the final output signal or pulse signal changes as the notches and projections on the rotor disk 10 alternately face the transformer 21. Thus, the angular position of an engine can be detected in accordance with a change in the signal level, and therefore this pulse signal can be utilized with engine ignition timing control systems, fuel supply control systems and the like.

We claim:
1. A rotation detecting apparatus comprising:
   a rotor disk having at least one projection and adjacent notch provided circularly along the periphery thereof with at least the projection being electrically conductive for having induced in it by a primary magnetic flux an eddy current which produces a counter magnetic flux;
   a field effect transistor having a source-drain path and a gate-source path;
   a transformer having an iron core and primary and secondary coils wound about said core, said core being positioned to face said projection and notch successively during rotation of said disk with said disk being disposed totally exteriorly of said core, said primary coil being operative to develop said primary flux for said secondary coil and being connected in series with the source-drain path of said field effect transistor, and said secondary coil being connected in parallel with the gate-source path of said field effect transistor and being responsive to said primary flux for developing a bias for said gate-source path,
   means forming a blocking oscillator including said transformer and said field effect transistor for generating a train of oscillation signals only while a said notch faces said transformer core during the rotation of said rotor disk to allow said secondary coil to be responsive to said primary flux to start said train of oscillation signals, said counter magnetic flux being produced only while a said projection faces said transformer core and then being operative to substantially cancel said primary flux for substantially reducing said bias and stopping said oscillation train; and
   output circuit means connected to said blocking oscillator and responsive to the presence and absence of said oscillation signal train for generating a pulse signal whose signal level changes in synchronization with the starting and stopping of said train of oscillation signals.

2. A rotation detecting apparatus according to claim 1, wherein said output circuit means includes filter circuit means connected to said blocking oscillator for filtering said train of oscillation signals, and output amplifier circuit means connected to said filter circuit for amplifying the filtered oscillation signals from said filter circuit.

3. A rotation detecting apparatus according to claim 1, wherein said output circuit means includes
   changing means A.C. coupled to said oscillator for changing each separate train of oscillation signals into substantially a square wave signal having modulations, and demodulation circuit means connected to said changing means for demodulating said square wave signals to remove said modulations, and an output amplifier circuit connected to said demodulation circuit means for amplifying the demodulated square wave signals from said demodulation circuit.

4. A rotation detecting apparatus according to claim 1, wherein said output circuit means includes current converter circuit means A.C. coupled to said blocking oscillator for converting said train of oscillation signals from one form into another one.

5. A rotation detecting apparatus according to claim 4 which further comprises a signal detector circuit connected to said current converter circuit for detecting the converter signal from said current converter circuit.

* * * * *